(12) United States Patent
Walter et al.

(10) Patent No.: US 10,454,240 B2
(45) Date of Patent: Oct. 22, 2019

(54) METHOD OF PRODUCING AN OPTOELECTRONIC COMPONENT

(71) Applicant: OSRAM Opto Semiconductors GmbH, Regensburg (DE)

(72) Inventors: Christoph Walter, Regensburg (DE); Roland Enzmann, Regensburg (DE); Markus Horn, Straubing (DE); Jan Seidenfaden, Neumarkt i.d. Oberpfalz (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/761,585

(22) PCT Filed: Sep. 15, 2016

(86) PCT No.: PCT/EP2016/071847
§ 371 (c)(1),
(2) Date: Mar. 20, 2018

(87) PCT Pub. No.: WO2017/050636
PCT Pub. Date: Mar. 30, 2017

(65) Prior Publication Data
US 2018/0351324 A1    Dec. 6, 2018

(30) Foreign Application Priority Data

Sep. 23, 2015    (DE) .................. 10 2015 116 092

(51) Int. Cl.
*H01S 5/022*    (2006.01)
*H01L 33/00*    (2010.01)
(Continued)

(52) U.S. Cl.
CPC ...... *H01S 5/02272* (2013.01); *H01L 33/0079* (2013.01); *H01L 33/62* (2013.01);
(Continued)

(58) Field of Classification Search
CPC combination set(s) only.
See application file for complete search history.

(56) References Cited

U.S. PATENT DOCUMENTS

2004/0053430 A1    3/2004    Kohashi et al.
2004/0195297 A1    10/2004    Powers et al.
(Continued)

FOREIGN PATENT DOCUMENTS

DE    10 2010 009 455 A1    9/2011
DE    10 2013 223 115 A1    5/2015
(Continued)

OTHER PUBLICATIONS

English translation of a Notice of Reasons for Rejection dated Feb. 5, 2019, from counterpart Japanese Patent Application No. 2018-514853.

*Primary Examiner* — Ratisha Mehta
(74) *Attorney, Agent, or Firm* — DLA Piper LLP (US)

(57) ABSTRACT

A method of producing an optoelectronic component includes providing a carrier including a top side; creating at the top side of the carrier a region that is recessed with respect to a mounting region of the top side to form a step between the mounting region and the recessed region; arranging at the top side of the carrier a metallization extending over the mounting region and the recessed region; creating a separating track in the metallization, wherein the metallization is completely severed at least in sections in the mounting region and is at least not completely severed in the recessed region; and arranging an optoelectronic semiconductor chip above the mounting region of the top side, wherein the optoelectronic semiconductor chip is aligned at the separating track.

11 Claims, 2 Drawing Sheets

(51) Int. Cl.
*H01L 33/62* (2010.01)
*H01L 33/64* (2010.01)
*H01S 5/024* (2006.01)

(52) U.S. Cl.
CPC ........ *H01L 33/642* (2013.01); *H01S 5/02268* (2013.01); *H01S 5/02461* (2013.01); *H01L 33/0095* (2013.01); *H01L 33/641* (2013.01); *H01L 2933/0066* (2013.01); *H01L 2933/0075* (2013.01)

(56) References Cited

U.S. PATENT DOCUMENTS

| | | |
|---|---|---|
| 2006/0125060 A1 | 6/2006 | Oyu |
| 2008/0116551 A1* | 5/2008 | Ferstl .................. H01S 5/02244 257/678 |
| 2009/0042327 A1 | 2/2009 | Nakatsuka |
| 2010/0140816 A1 | 6/2010 | Johannes et al. |
| 2016/0190398 A1* | 6/2016 | Nam .................... H01L 33/486 257/99 |

FOREIGN PATENT DOCUMENTS

| | | |
|---|---|---|
| JP | 63-151093 | 6/1988 |
| JP | 2003-46181 | 2/2003 |
| JP | 2008-16507 | 1/2008 |
| JP | 2009-26819 | 2/2009 |
| JP | 2009-103915 | 5/2009 |
| JP | 2009-212179 A | 9/2009 |
| WO | 2015/071305 A1 | 5/2015 |

* cited by examiner

METHOD OF PRODUCING AN OPTOELECTRONIC COMPONENT

TECHNICAL FIELD

This disclosure relates to a method of producing an optoelectronic component.

BACKGROUND

It is known to arrange laser chips on carriers such that an emission facet of the laser chip projects over an outer edge of the carrier. An undesired contamination of the emission facet with solder may thereby be prevented. In that case, however, the projection should not be chosen to be of excessive magnitude to ensure a sufficient cooling of the laser chip. Reliable positioning of the laser chip during automated chip mounting has proved to be difficult.

SUMMARY

We provide a method of producing an optoelectronic component including providing a carrier including a top side, creating at the top side of the carrier a region that is recessed with respect to a mounting region of the top side to form a step between the mounting region and the recessed region, arranging at the top side of the carrier a metallization extending over the mounting region and the recessed region, creating a separating track in the metallization, wherein the metallization is completely severed at least in sections in the mounting region and is at least not completely severed in the recessed region, and arranging an optoelectronic semiconductor chip above the mounting region of the top side, wherein the optoelectronic semiconductor chip is aligned at the separating track.

Figure 1:
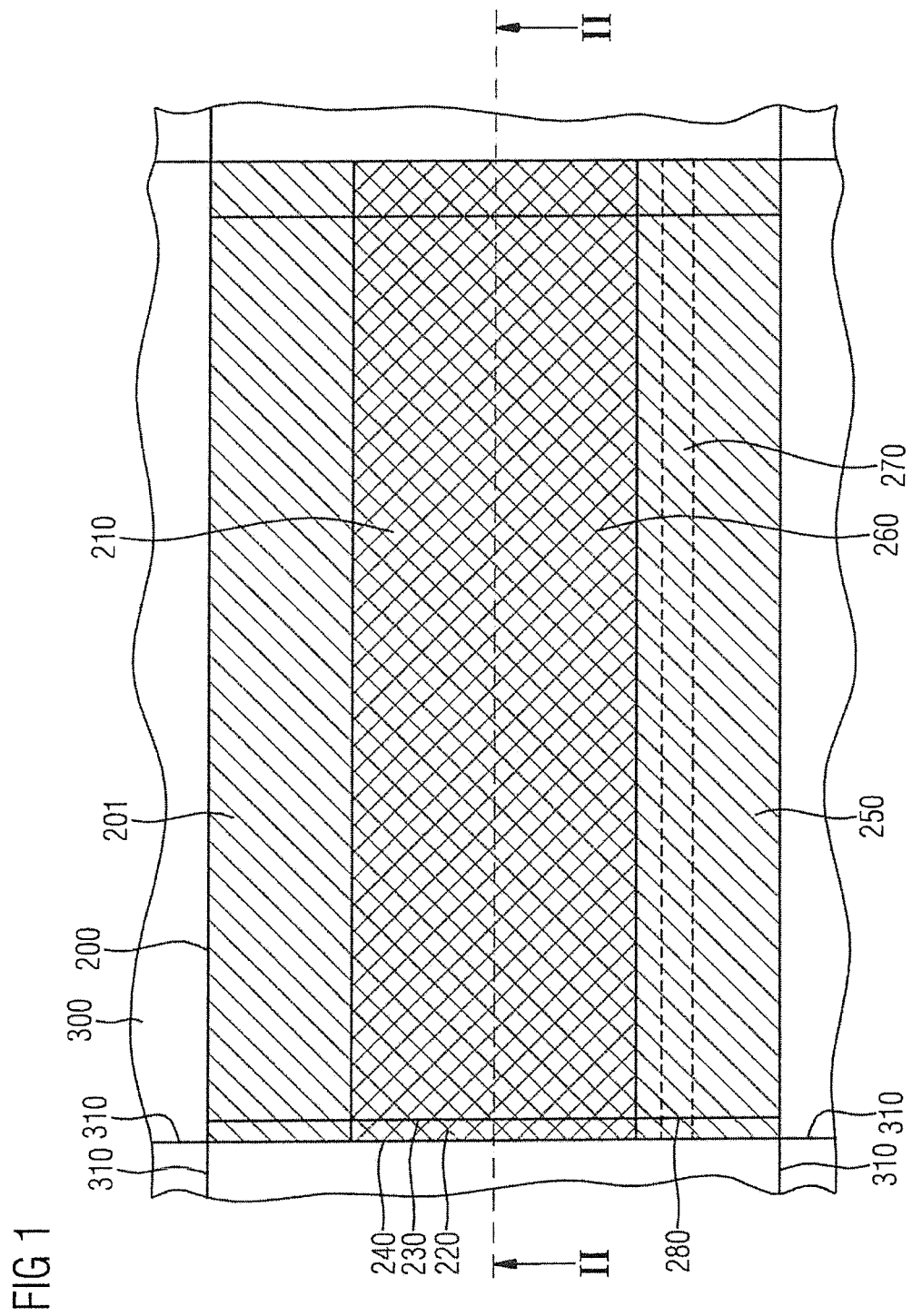
FIG. 1 schematically shows a plan view of a top side of a carrier arranged in a carrier assemblage.

LIST OF REFERENCE SIGNS 100 optoelectronic component
110 optoelectronic semiconductor chip
111 top side
112 underside
120 anode contact
130 emission facet
200 carrier
201 top side
210 mounting region
220 recessed region
230 step
240 outer edge
250 metallization
260 solder
270 separating track
280 boundary
300 carrier assemblage
310 separating plane

DETAILED DESCRIPTION

Our method of producing an optoelectronic component comprises steps of providing a carrier comprising a top side, creating at the top side of the carrier a region that is recessed with respect to a mounting region of the top side, wherein a step is formed between the mounting region and the recessed region, arranging at the top side of the carrier a metallization extending over the mounting region and the recessed region, creating a separating track in the metallization, wherein the metallization is completely severed at least in sections in the mounting region and is at least not completely severed in the recessed region, and arranging an optoelectronic semiconductor chip above the mounting region of the top side, wherein the optoelectronic semiconductor chip is aligned at the separating track.

Advantageously, the method results in a distinct optical contrast between the material of the carrier that is exposed in the mounting region in the region of the separating track and the metallization not completely severed in the recessed region in the region of the separating track. A high-contrast alignment marking is formed as a result. The alignment marking allows a reliable automated positioning of the optoelectronic semiconductor chip above the mounting region of the top side of the carrier.

The optoelectronic semiconductor chip may be arranged in a manner projecting over the step. This advantageously reduces a risk of that part of the optoelectronic semiconductor chip arranged in a projecting manner being contaminated by a connecting material used to connect the optoelectronic semiconductor chip to the carrier during the process of arranging the optoelectronic semiconductor chip above the mounting region of the top side of the carrier.

Aligning at the separating track may comprise optically detecting a position of a boundary between the metallization completely severed at least in sections in the mounting region and the metallization at least not completely severed in the recessed region. Advantageously, a pronounced optical contrast arises in this method between the material of the carrier that is exposed in the region of the metallization completely severed at least in sections in the mounting region and the metallization at least not completely severed in the recessed region, which pronounced optical contrast may be reliably detected in an automated manner, for example, by an optical image recognition system. The position of the boundary may be detected in a precise manner as a result. At the same time, the position of the boundary is precisely defined by the separating track such that overall, a precise alignment of the optoelectronic semiconductor chip with only small inaccuracies is made possible.

The separating track may be created rectilinearly and perpendicularly to the step. Advantageously, a particularly simple and accurate alignment of the optoelectronic semiconductor chip is made possible as a result. Moreover, creating the separating track rectilinearly is advantageously possible in a particularly simple manner.

The carrier may be provided in a carrier assemblage. After the process of creating the separating track, the carrier assemblage is divided to singulate the carrier. In this case, an outer edge of the carrier is formed by the dividing. The recessed region adjoins the outer edge such that the step is oriented parallel to the outer edge. Advantageously, the method thereby enables a parallel production of a plurality of carriers in common work processes. The production costs per carrier and the time required to produce a carrier are reduced as a result. A further advantage is that the process steps performed on the carrier assemblage may be carried out more simply and with higher accuracy owing to the larger dimensions of the carrier assemblage. The recessed region adjoining the outer edge of the carrier advantageously ensures that the carrier, at its top side in the region of the outer edge, comprises no bones by which a precise alignment and mounting of the optoelectronic semiconductor chip are made more difficult or prevented.

Creating the separating track may be carried out by sawing or by a laser. Advantageously, these methods enable the separating track to be created rapidly, simply and reproducibly with a precisely defined track depth and track width.

The separating track may be created such that the metallization is not severed in the recessed region. Advantageously, this results in a particularly distinct contrast between the metallization completely severed at least in sections in the mounting region and the metallization not severed in the recessed region at the separating track.

Before arranging the optoelectronic semiconductor chip, a solder may be arranged on the metallization on the mounting region of the top side. The optoelectronic semiconductor chip is then arranged on the solder. In this case, the solder may mechanically secure the optoelectronic semiconductor chip and electrically contact the optoelectronic semiconductor chip.

The optoelectronic semiconductor chip may be a laser chip. The optoelectronic component is then a laser component.

The laser chip may be arranged such that an emission facet of the laser chip projects over the step. Advantageously, this ensures that during the process of arranging the laser chip above the mounting region of the top side of the carrier, no connecting material used to secure the laser chip, for example, solder reaches the emission facet of the laser chip.

An anode contact of the laser chip may face the top side of the carrier. An emission region of the laser chip may thereby be arranged particularly close to the top side of the carrier, as a result of which an effective cooling of the laser chip may be achieved.

The above-described properties, features and advantages and the way in which they are achieved will become clearer and more clearly understood in association with the following description of the examples which are explained in greater detail in association with the drawings.

Figure 2:
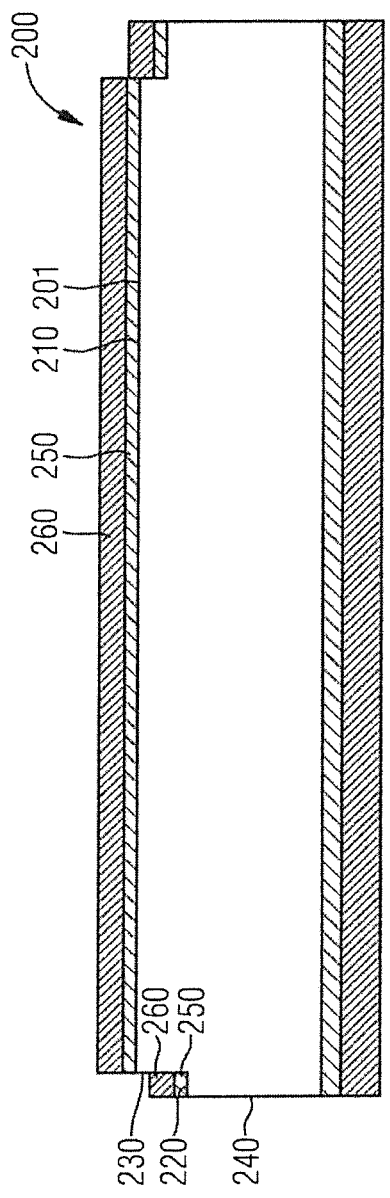
FIG. 2 schematically shows a sectional side view of the carrier.

FIG. 1 shows a plan view of a carrier 200 in a schematic illustration. FIG. 2 shows a sectional side view of the carrier 200. The sectional plane on which the carrier 200 is cut in the illustration in FIG. 2 is depicted in FIG. 1. The carrier 200 may also be referred to as a surmount.

The carrier 200 is configured as a substantially flat sheet comprising a top side 201. The carrier 200 may comprise an electrically insulating material, for example, silicon or a ceramic.

The carrier 200 may be provided in a carrier assemblage 300. The carrier assemblage 300 is indicated in the illustration in FIG. 1. The carrier assemblage 300 comprises a plurality of carriers 200 of identical type arranged in a plane alongside one another and connected to one another integrally in a continuous fashion. The individual carriers 200 may, for example, each comprise a rectangular shape and be arranged in a rectangular grid in the carrier assemblage 300.

The carrier assemblage 300 enables a parallel production of a plurality of carriers 200 in common work processes. It is only after the conclusion of the common processing steps that the individual carriers 200 are singulated by the carrier assemblage 300 being divided along separating planes 310. Dividing the carrier assemblage 300 along the separating planes 310 may be carried out by a sawing process, for example.

The top side 201 of the carrier 200 comprises a mounting region 210 and a region 220 that is recessed with respect to the mounting region 210. A step 230 is formed at the boundary between the recessed region 220 and the mounting region 210, the height of the top side 201 of the carrier 200 changing at the step.

The recessed region 220 of the top side 201 of the carrier 200 is arranged such that, after the process of dividing the carrier assemblage 300 along the separating planes 310, the recessed region 220 adjoins an outer edge 240 of the carrier 200 formed at a separating plane. This means that the recessed region 220 is arranged in a marginal region of the top side 201 of the carrier 200. It is expedient if both the outer edge 240 of the carrier 200 formed at the separating plane 310 and the step 230 formed between the recessed region 220 and the mounting region 210 run rectilinearly and are oriented parallel to one another.

The recessed region 220 may have been created by the top side 201 of the carrier 200 having been processed by part of the material of the carrier 200 having been removed in the recessed region 220, for example, by an etching method or a separating method, for instance a sawing method. The recessed regions 220 of a plurality of carriers 200 of the carrier assemblage 300 may have been created simultaneously in this case. Moreover a plurality of recessed regions 220 per carrier 200 may have been created, for example, at mutually opposite outer edges of the respective carrier 200, as illustrated in the example in FIGS. 1 and 2.

After the process of creating the recessed region 220, a metallization 250 has been arranged at the top side 201 of the carrier 200. The metallization 250 extends both over the recessed region 220 and over the mounting region 210 of the top side 201 of the carrier 200. The metallization 250 may comprise titanium, platinum and/or gold, for example. The metallization 250 comprises a thickness (measured perpendicularly to the top side 201 of the carrier 200) which is smaller than the depth of the recessed region 220. By way of example, the metallization 250 may comprise a thickness of 1 μm.

After the process of arranging the metallization 250 at the top side 201 of the carrier 200, a separating track 270 has been created in the metallization 250 at the top side 201 of the carrier 200. The separating track 270 is configured rectilinearly and extends perpendicularly to the step 230 between the recessed region 220 and the mounting region 210 and thus also perpendicularly to the outer edge 240 of the carrier 200 formed during the process of dividing the carrier assemblage 300. In this case, the separating track 270 extends both over the mounting region 210 and over the recessed region 220 of the top side 201 of the carrier 200.

In the mounting region 210 of the top side 201 of the carrier 200, the metallization 250 is completely severed at least in sections in the region of the separating track 270 such that in the region of the separating track 270 in the mounting region 210 the material of the carrier 200 is at least partly exposed. In the recessed region 220 of the top side 201 of the carrier 200, by contrast, the metallization 250 in the separating track 270 is at least not completely severed. Consequently, in the recessed region 220 of the top side 201 of the carrier 200 in the region of the separating track 270 the material of the carrier 200 is not exposed, but rather still covered by the metallization 250. It is possible to create the separating track 270 such that in the recessed region 220 of the top side 201 of the carrier 200 the metallization 250 is not severed at all by the separating track 270. Thus, in a direction perpendicular to the top side 201 of the carrier 200 the separating track 270 expediently comprises a depth larger than the thickness of the metallization 250, but smaller than the sum of the thickness of the metallization 250 and the depth by which the recessed region 220 is recessed with respect to the mounting region 210. The separating track 270 may comprise a depth of a few μm, for example.

The separating track 270 may have been created by sawing or a laser, for example. If the separating track 270 has been created by sawing, then the separating track 270 may also be referred to as a sawing track.

It is possible to create the separating track 270 in common processing steps for all the carriers 200 of the carrier assemblage 300.

In the example shown in FIGS. 1 and 2, a solder 260 has been arranged on the metallization 250 at the top side 201 of the carrier 200. The process of arranging the solder 260 may have been carried out before or after the process of creating the separating track 270. The solder 260 extends over a part of the mounting region 210 of the top side 201 of the carrier 200 and may also extend over a part of the recessed region 220 of the top side 201 of the carrier 200. However, the solder 260 does not extend over that part of the top side 201 of the carrier 200 in which the separating track 270 runs. The process of arranging the solder 260 may be dispensed with if the optoelectronic semiconductor chip subsequently arranged above the top side 201 of the carrier 200 is secured and electrically contacted in some other way.

Figure 3:
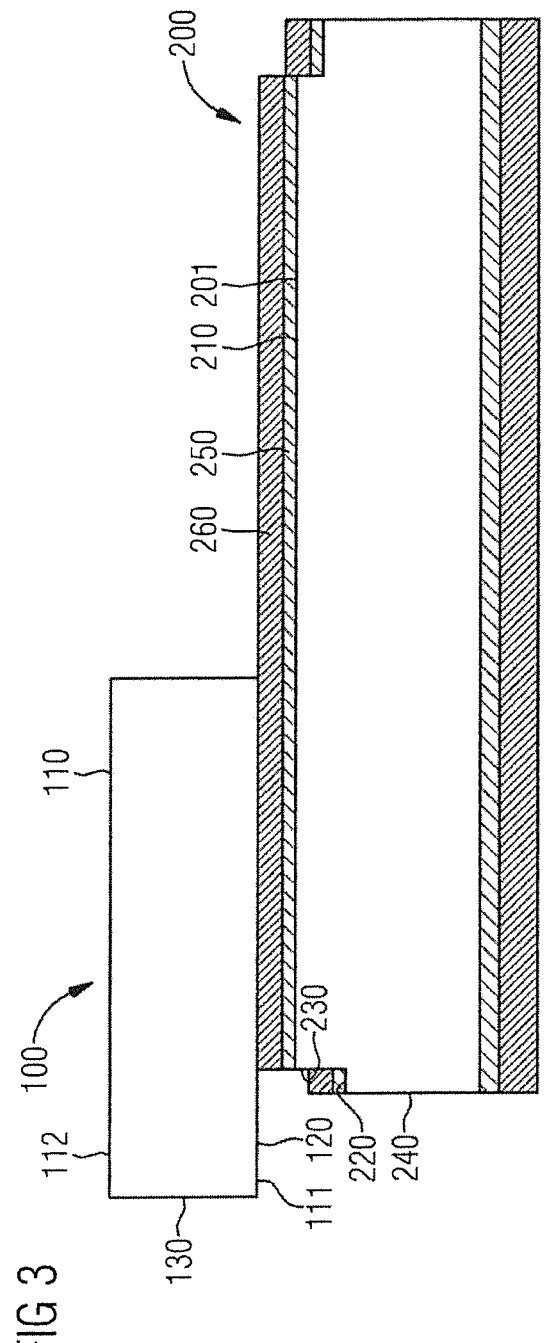
FIG. 3 schematically shows a sectional side view of an optoelectronic component including the carrier and an optoelectronic semiconductor chip.

FIG. 3 shows a schematic sectional side view of the carrier 200 in a processing state temporally succeeding the illustration in FIGS. 1 and 2.

An optoelectronic semiconductor chip 110 has been arranged above the top side 201 of the carrier 200. The carrier 200 and the optoelectronic semiconductor chip 110 jointly form an optoelectronic component 100. The optoelectronic semiconductor chip 110 may be a laser chip, for example. In this case, the optoelectronic component 100 is a laser component.

The optoelectronic semiconductor chip 110 has been arranged above the mounting region 210 of the top side 201 of the carrier 200. In this case, the optoelectronic semiconductor chip 110 was aligned at the separating track 270 to define the position and/or orientation of the optoelectronic semiconductor chip 110 at the top side 201 of the carrier 200.

To align the optoelectronic semiconductor chip 110 relative to the separating track 270, the position of a boundary 280 between the metallization 250 completely severed at least in sections in the mounting region 210 and the metallization 250 at least not completely severed in the recessed region 220 of the top side 201 of the carrier 200 was detected. This detection may be carried out optically, for example, by a camera, for example. At the boundary 280 between the metallization 250 completely severed at least in sections in the mounting region 210 and the metallization 250 at least not completely severed in the recessed region 220, an optically clearly discernible contrast between the metallization 250 and the exposed material of the carrier 200 is formed, which contrast is well suited to an optical detection and the position of which contrast relative to the step 230 at the top side 201 of the carrier 200 is precisely defined.

The optoelectronic semiconductor chip 110 has been arranged above the top side 201 of the carrier 200 such that it projects over the step 230. The length of the projection was able to be precisely defined by the alignment at the separating track 270, in particular by the alignment at the boundary 280.

The optoelectronic semiconductor chip 110 comprises a top side 111 and an underside 112 opposite the top side 111. The optoelectronic semiconductor chip 110 was arranged above the top side 201 of the carrier 200 such that the top side 111 of the optoelectronic semiconductor chip 110 faces the top side 201 of the carrier 200. The optoelectronic semiconductor chip 110 is arranged on the solder 260 arranged in the mounting region 210 of the top side 201 of the carrier 200 and is secured by the solder 260. It is possible to dispense with arranging the solder 260 at the top side 201 of the carrier 200 and instead, for example, to arrange a solder at the top side 111 of the optoelectronic semiconductor chip 110 before the latter is arranged above the top side 201 of the carrier 200. Instead of the solder 260, an adhesive, for example, an electrically conductive adhesive or another securing material may also be used to secure the optoelectronic semiconductor chip 110.

An electrical contact of the optoelectronic semiconductor chip 110, for example, an anode contact 120 may be formed at the top side 111 of the optoelectronic semiconductor chip 110. In this case, the anode contact 120 electrically conductively connects to the metallization 250 of the carrier 200 by the solder 260. This makes it possible to electrically drive the optoelectronic semiconductor chip 110 via the metallization 250.

If the optoelectronic semiconductor chip 110 is a laser chip, then that side face of the optoelectronic semiconductor chip 110 projecting over the step 230 between the recessed region 220 and the mounting region 210 at the top side 201 of the carrier 200 forms an emission facet 130 of the optoelectronic semiconductor chip 110. During operation of the optoelectronic semiconductor chip 110, the latter emits a laser beam at the emission facet 130 in a direction perpendicular to the emission facet 130. In this case, the point where the laser beam emerges may lie near the top side 111 of the optoelectronic semiconductor chip 110.

The projection of the emission facet 130 over the step 230 at the top side 201 of the carrier 200 prevents solder 260 from reaching the emission facet 130 and contaminating the latter during the securing of the optoelectronic semiconductor chip 110 at the top side 201 of the carrier 200. The recessed region 220 created at the top side 201 of the carrier 200 ensures that in the region of the step 230 no bones formed at the outer edge 240 of the carrier 200 during the process of dividing the carrier assemblage 300 are present, which bones might adversely affect the securing and alignment of the optoelectronic semiconductor chip 110.

Our methods have been illustrated and described in greater detail on the basis of the preferred examples. Nevertheless, this disclosure is not restricted to the examples disclosed. Rather, other variations may be derived therefrom by those skilled in the art, without departing from the scope of protection of the appended claims.

This application claims priority of DE 10 2015 116 092.7, the subject matter of which is incorporated herein by reference.

The invention claimed is:
1. A method of producing an optoelectronic component comprising:
providing a carrier comprising a top side;

creating at the top side of the carrier a region that is recessed with respect to a mounting region of the top side to form a step between the mounting region and the recessed region;

arranging at the top side of the carrier a metallization extending over the mounting region and the recessed region;

creating a separating track in the metallization, wherein the metallization is completely severed at least in sections in the mounting region and is at least not completely severed in the recessed region; and arranging an optoelectronic semiconductor chip above the mounting region of the top side, wherein the optoelectronic semiconductor chip is aligned at the separating track.

2. The method as claimed in claim 1, wherein the optoelectronic semiconductor chip projects over the step.

3. The method as claimed in claim 1, wherein aligning at the separating track comprises optically detecting a position of a boundary between the metallization completely severed at least in sections in the mounting region and the metallization at least not completely severed in the recessed region.

4. The method as claimed in claim 1, wherein the separating track is created rectilinearly and perpendicularly to the step.

5. The method as claimed in claim 1,
wherein the carrier is provided in a carrier assemblage, the carrier assemblage is divided after the process of creating the separating track to singulate the carrier, an outer edge of the carrier is formed by the dividing, the recessed region adjoins the outer edge, and the step is oriented parallel to the outer edge.

6. The method as claimed in claim 1, wherein creating the separating track is carried out by sawing or a laser.

7. The method as claimed in claim 1, wherein the separating track is created such that the metallization is not severed in the recessed region.

8. The method as claimed in claim 1,
wherein, before arranging the optoelectronic semiconductor chip, solder is arranged on the metallization on the mounting region of the top side, and
the optoelectronic semiconductor chip is arranged on the solder.

9. The method as claimed in claim 1, wherein the optoelectronic semiconductor chip is a laser chip.

10. The method as claimed in claim 9, wherein the laser chip is arranged such that an emission facet of the laser chip projects over the step.

11. The method as claimed in claim 9, wherein an anode contact of the laser chip faces the top side of the carrier.

* * * * *